（12） United States Patent
Won et al.

(10) Patent No.: US 8,890,297 B2
(45) Date of Patent: Nov. 18, 2014

(54) LIGHT EMITTING DEVICE PACKAGE

(75) Inventors: Yu Ho Won, Seoul (KR); Geun Ho Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/331,984

(22) Filed: Dec. 20, 2011

(65) Prior Publication Data

US 2012/0086039 A1 Apr. 12, 2012

Related U.S. Application Data

(63) Continuation of application No. 12/667,743, filed as application No. PCT/KR2008/003960 on Jul. 4, 2008, now Pat. No. 8,610,255.

(30) Foreign Application Priority Data

Jul. 6, 2007 (KR) .................. 10-2007-0067986

(51) Int. Cl.
*H01L 33/00* (2010.01)
*H01L 31/048* (2014.01)
*H01L 33/58* (2010.01)
*H01L 33/50* (2010.01)
*H01L 33/48* (2010.01)
*H01L 33/62* (2010.01)

(52) U.S. Cl.
CPC ..... *H01L 33/505* (2013.01); *H01L 2224/48247* (2013.01); *H01L 33/58* (2013.01); *H01L 33/62* (2013.01); *H01L 33/48* (2013.01); *H01L 33/507* (2013.01)

USPC ............ 257/678; 257/99; 257/100; 257/103; 257/291; 257/292; 257/293; 257/431; 257/432; 257/433; 257/434; 257/712; 257/725; 257/728; 257/75; 257/88; 257/E23.004

(58) Field of Classification Search
USPC ............. 257/99, 100, 678, E31.117, E31.127
See application file for complete search history.

(56) References Cited

U.S. PATENT DOCUMENTS

| 5,696,389 | A | 12/1997 | Ishikawa et al. | |
| 6,517,218 | B2 * | 2/2003 | Hochstein | ...................... 362/294 |
| 6,614,103 | B1 | 9/2003 | Durocher et al. | |
| 6,670,751 | B2 * | 12/2003 | Song et al. | ...................... 313/512 |
| 6,791,116 | B2 | 9/2004 | Hirano et al. | |

(Continued)

FOREIGN PATENT DOCUMENTS

CN 2563753 Y 7/2003
EP 1187226 A1 3/2002

(Continued)

OTHER PUBLICATIONS

Full English translation of CN-2563753-Y dated Jul. 30, 2003.

(Continued)

*Primary Examiner* — Zandra Smith
*Assistant Examiner* — Tsz Chiu
(74) *Attorney, Agent, or Firm* — Birch, Stewart, Kolasch & Birch, LLP

(57) ABSTRACT

A light emitting device package according to embodiments comprises: a package body; a lead frame on the package body; a light emitting device supported by the package body and electrically connected with the lead frame; a filling material surrounding the light emitting device; and a phosphor layer comprising phosphors on the filling material.

20 Claims, 4 Drawing Sheets

(56) References Cited

U.S. PATENT DOCUMENTS

| | | |
|---|---|---|
| 7,291,866 B2 | 11/2007 | Oshio et al. |
| 7,301,176 B2 | 11/2007 | Abe et al. |
| 7,597,468 B2 * | 10/2009 | Weng et al. ............ 362/612 |
| 7,910,946 B2 | 3/2011 | Kamada |
| 7,960,819 B2 | 6/2011 | Loh et al. |
| 8,519,427 B2 * | 8/2013 | Lee .......................... 257/99 |
| 2003/0153108 A1 | 8/2003 | Durocher et al. |
| 2004/0201028 A1 * | 10/2004 | Waitl et al. .............. 257/99 |
| 2004/0232825 A1 | 11/2004 | Sorg |
| 2005/0139846 A1 | 6/2005 | Park et al. |
| 2005/0173708 A1 | 8/2005 | Suehiro et al. |
| 2005/0218421 A1 * | 10/2005 | Andrews et al. ........ 257/100 |
| 2005/0264194 A1 | 12/2005 | Ng et al. |
| 2005/0269587 A1 | 12/2005 | Loh et al. |
| 2006/0103012 A1 | 5/2006 | Chin |
| 2007/0063321 A1 | 3/2007 | Han et al. |
| 2007/0075306 A1 | 4/2007 | Hayashi et al. |
| 2007/0090382 A1 | 4/2007 | Ryu |
| 2007/0120463 A1 | 5/2007 | Hayashi et al. |
| 2007/0278512 A1 * | 12/2007 | Loh et al. ................ 257/99 |
| 2008/0089072 A1 | 4/2008 | Kim et al. |
| 2008/0231196 A1 | 9/2008 | Weng et al. |
| 2009/0050926 A1 | 2/2009 | Suehiro et al. |
| 2009/0289268 A1 | 11/2009 | Kamada |
| 2011/0140142 A1 | 6/2011 | Won et al. |
| 2012/0091478 A1 | 4/2012 | Lee et al. |

FOREIGN PATENT DOCUMENTS

| | | |
|---|---|---|
| EP | 1 587 151 A2 | 10/2005 |
| EP | 1 760 795 A2 | 3/2007 |
| EP | 1912263 A2 | 4/2008 |
| JP | 2003-324215 A | 11/2003 |
| JP | 2005-50827 A | 2/2005 |
| JP | 2005-183900 A | 7/2005 |
| JP | 2005-197633 A | 7/2005 |
| JP | 2005-252219 A | 9/2005 |
| JP | 2005-317661 A | 11/2005 |
| JP | 2005-332963 A | 12/2005 |
| JP | 2005-353914 A | 12/2005 |
| JP | 3120556 U | 4/2006 |
| JP | 2006-237199 A | 9/2006 |
| JP | 2006-324438 A | 11/2006 |
| JP | 2007-36199 A | 2/2007 |
| JP | 2007-116138 A | 5/2007 |
| JP | 2007-142474 A | 6/2007 |
| JP | 2008-98600 A | 4/2008 |
| JP | 2010-532929 A | 10/2010 |
| KR | 10-2004-0044701 A | 5/2004 |
| KR | 10-2005-0031705 A | 4/2005 |
| WO | WO 2006/059828 A1 | 6/2006 |
| WO | WO 2006065007 A1 * | 6/2006 |
| WO | WO 2006/098545 A2 | 9/2006 |
| WO | WO 2007/015732 A2 | 2/2007 |
| WO | WO 2007/069399 A1 | 6/2007 |
| WO | WO 2009/003176 A1 | 12/2008 |

OTHER PUBLICATIONS

Full English translation of JP-2005-050827-A dated Feb. 24, 2005.
Full English translation of JP-2005-332963-A dated Dec. 2, 2005.
Full English translation of JP-2007-036199-A dated Feb. 8, 2007.
Full English translation of KR-10-2004-0044701-A dated May 31, 2004.
Machine generated English translation of JP-2005-183900-A dated Jul. 7, 2005.
Machine generated English translation of JP-2006-237199-A dated Sep. 7, 2006.
Machine generated English translation of JP-2006-324438-A dated Nov. 30, 2006.
Machine generated English translation of JP-2007-142474-A dated Jun. 7, 2007.
Machine generated English translation of JP-3120556-U dated Mar. 22, 2006.
Machine generated English translation of JP-3120556-U dated Apr. 13, 2006.
EP Office Action for Appl. No. 131664676.5 dated May 28, 2014.

* cited by examiner

LIGHT EMITTING DEVICE PACKAGE

CROSS REFERENCE TO RELATED APPLICATION

This application is a continuation of co-pending application Ser. No. 12/667,743, filed on Jan. 5, 2010, which claims priority to Korean Patent Application No. 10-2007-0067986, filed on Jul. 6, 2007.

TECHNICAL FIELD

The present disclosure relates to a light emitting device package.

BACKGROUND ART

A light emitting diode (LED) is a semiconductor light emitting device converting a current into light.

The wavelength of light emitted from the LED depends on a semiconductor material used for manufacturing the LED because the wavelength of the emitted light depends on a band-gap of a semiconductor material representing an energy difference between electrons in a valence band and electrons in a conduction band.

Recently, as the brightness of the LED increases more and more, the LED is used as a light source for a display device, a lighting apparatus, and a light source for an automobile. The LED can be realized to emit white light with excellent efficiency by using a fluorescent material or combining LEDs of various colors.

To use the LED for this purpose, the operation voltage of a device should be lowered and a light emitting efficiency and brightness should be high.

In manufacturing such an LED, a silicon gel or an epoxy resin is coated on an LED chip of a package to increase efficiency and protect the LED chip. At this point, there is a method for coating a silicon gel or an epoxy resin, and a coating shape having a great influence on a light emitting efficiency.

Also, recently, a light emitting device package includes a lens to increase a light emitting efficiency. Such a lens not only increases a light emitting efficiency but also controls light distribution characteristic to a desired angle.

In a method of realizing various colors of an LED, a method of coating phosphor on an LED chip to realize various colors is generally used. At this point, a light emitting efficiency can change depending on a method and a position by which the phosphors are coated.

DISCLOSURE OF INVENTION

Technical Problem

Embodiments provide a light emitting device package of a new structure.

Embodiments also provide a light emitting device package that can increase a light emitting efficiency without an additional process by manufacturing a lens shape using a dispensing method during a process of coating a silicon gel or an epoxy resin on the light emitting device package.

Embodiments also provide a light emitting device package that can reduce an influence by heat emitted from a light emitting device, on phosphors.

Embodiments also provide a light emitting device package that allows light exited from phosphors not to be absorbed to a light emitting device but to be effectively emitted to the outside.

Embodiments also provide a light emitting device package with an improved color uniformity.

Technical Solution

In an embodiment, a light emitting device package comprises: a package body; a lead frame in the package body; a light emitting device supported by the package body and electrically connected with the lead frame; a filling material surrounding the light emitting device; and a phosphor layer comprising phosphors on the filling material.

In an embodiment, a light emitting device package comprises: a package body; a lead frame in the package body; a light emitting device supported by the package body and electrically connected with the lead frame; a filling material surrounding the light emitting device and having a dome-shaped upper surface; a phosphor layer comprising phosphors on the filling material; and a molding portion having a dome-shape upper shape on the phosphor layer.

Advantageous Effects

Embodiments can provide a light emitting device package of a new structure.

Embodiments can also provide a light emitting device package that can increase a light emitting efficiency without an additional process by manufacturing a lens shape using a dispensing method during a process of coating a silicon gel or an epoxy resin on the light emitting device package.

Embodiments can also provide a light emitting device package that can reduce an influence by heat emitted from a light emitting device, on phosphors.

Embodiments can also provide a light emitting device package that allows light exited from phosphors not to be absorbed to a light emitting device but to be effectively emitted to the outside.

Embodiments also provide a light emitting device package with an improved color uniformity.

MODE FOR THE INVENTION

Figure 1:
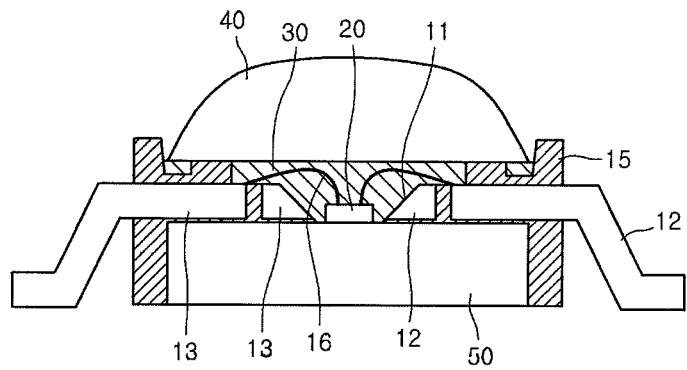
FIG. 1 is a view explaining a light emitting device package according to an embodiment 1.

Reference will now be made in detail to the embodiments of the present disclosure with reference to the accompanying drawings.

While numerous modifications and variations are allowed by the present disclosure, specific embodiments thereof are exemplarily illustrated in the drawings, which will be described in detail. However, the embodiments are not intended for limiting the present disclosure to the disclosed specific forms but rather the present disclosure includes all modifications, equivalents, and alternatives matching with the spirit of the present disclosure as defined by the appended claims.

Same reference numerals denote the same elements through the descriptions of the drawings. The dimensions of layers and regions in the drawings are exaggerated for clarity.

In the case where an element such as a layer, region, and a substrate is mentioned as being "on" another element, it is understood that it is directly on the another element or an intervening element may exist therebetween. In the case where a portion of an element such as a surface is expressed as an "inner portion", it is understood that the portion is located far from the outer side of a device than other portions of the element.

It is understood that these terminologies are intended to include other directions of a device in addition to a direction described in the drawings. Last, a terminology "directly" means that there is no intervening element. As used here, a terminology "and/or" includes one or any combination of two or more, and all combinations of described associated items.

Embodiment 1

FIG. 1 is a view explaining a light emitting device package according to an embodiment 1.

Referring to FIG. 1, in the light emitting device package, a light emitting device 20 is mounted in a light emitting device mounting portion 11 provided to a package body 15. The light emitting device 20 is electrically connected, through wires 16, to first and second lead frames 12 and 13 connected to the outside by passing through the package body 15. A heatsink portion 50 can be disposed under the light emitting device 20.

The light emitting device mounting portion 11 is a space formed by the first and second lead frames 12 and 13, the heatsink portion 150, and the package body 15, and provides a cavity in which the light emitting device 20 can be mounted.

The first and second lead frames 12 and 13, and the heatsink portion 50 can be formed of copper, and a reflective layer formed of Ag or Al and having a high reflectivity can be formed on the surface of them.

The upper portion of the light emitting device mounting portion 11 including the light emitting device 20 is filled with a filling material 30, and a lens 40 is attached on the filling material 30. The filling material 30 can include phosphors.

At this point, the package body 15 is formed by injection molding with the first and second lead frames 12 and 13, and the heatsink portion 50 disposed.

Therefore, the first and second lead frames 12 and 13, and the heatsink portion 50 can be fixed by the package body 15. The first and second lead frames 12 and 13 can pass through the package body 15 and be connected to the outside.

The package body 15 can be formed of a plastic material that can be formed by injection molding.

For the light emitting device 20, a horizontal light emitting device, a flip-chip bonded light emitting device, and a vertical light emitting device can be applied depending on the formation position of an electrode layer.

Here, the vertical light emitting device can have a structure in which a light emitting device is formed on a support layer formed of metal or a semiconductor.

In the light emitting device package according to the embodiment, the lens 40 is attached. The lens 40 can improve the light power of the light emitting device, and control a light distribution characteristic.

Embodiment 2

Figure 2:
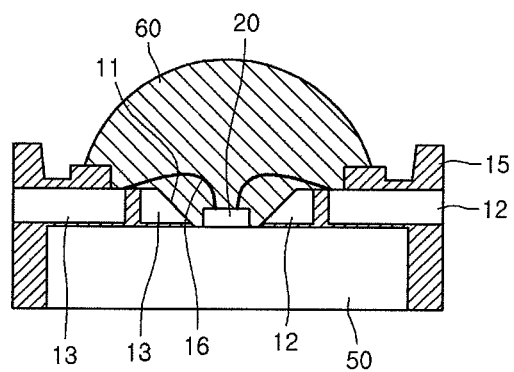
FIG. 2 is a view explaining a light emitting device package according to an embodiment 2.

FIG. 2 is a view explaining a light emitting device package according to an embodiment 2.

Hereinafter, the embodiment 2 is described with reference to FIG. 2. Parts not explained can be the same as those of the embodiment 1.

As in the embodiment 1, a separately manufactured lens can be attached to the light emitting device package. Also, as in FIG. 2, a silicon gel or an epoxy resin is dispensed on a light emitting device 20 to form a lens 60 also serving as a filling material. The lens 60 can include phosphors.

Particularly, since the lens 60 is formed using a dispensing method, a separate lens manufacturing is not required. Since the lens 60 can be simultaneously formed during a process of filling a filling material on the light emitting device 20, the lens 60 can be formed without an additional process, so that light power can be improved.

Dispensing is a method of coating and forming liquid gel or resin using a nozzle, which is similar to an inkjet method. The dispensing includes hardening coated gel or resin.

To realize a light emitting device package emitting white, green, red, and yellow light, phosphors are coated on a blue or near ultraviolet light emitting device. According to the light emitting device package of the embodiment, phosphors are mixed in the form of powder with silicon gel or an epoxy resin, and coated on the light emitting device 20.

For example, in the case where yellow phosphors are coated on a blue light emitting device, blue light emitted from the blue light emitting device excites yellow phosphors to generate yellow light. The blue light is mixed with the yellow light to create white light.

Also, to prevent a phenomenon that emission from the phosphors is absorbed in a chip of the light emitting device 20 and so efficiency reduces, silicon gel or an epoxy resin is filled on the chip of the light emitting device 20, and the phosphors are mixed with the silicon gel or the epoxy resin and coated thereon to form a lens, so that a white light emitting device package of a high efficiency can be realized.

At this point, in coating the silicon gel or the epoxy resin on the light emitting device 20, a dispersing agent or a diffusing agent can be mixed and coated in order to effectively disperse light emitted from the light emitting device 20, and increase the refractive index of a resin and thus improve light extraction of the light emitting device chip.

Embodiment 3

Figure 3:
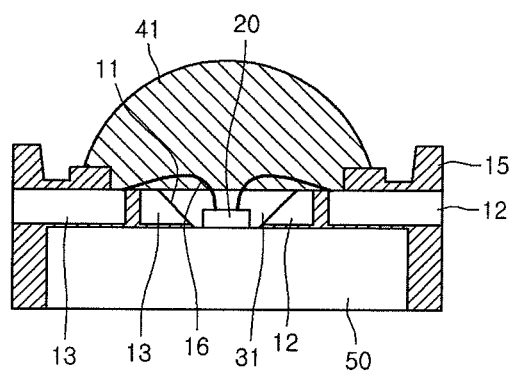
FIGS. 3 to 5 are views explaining a light emitting device package according to an embodiment 3.
Figure 4:
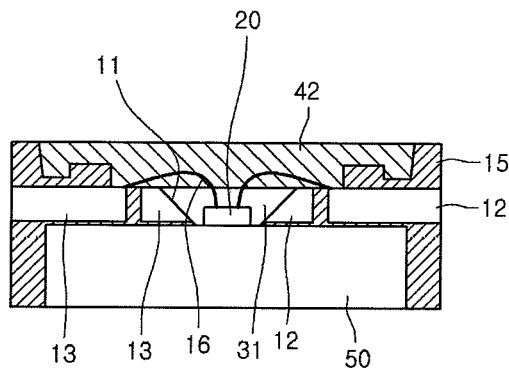
Figure 5:
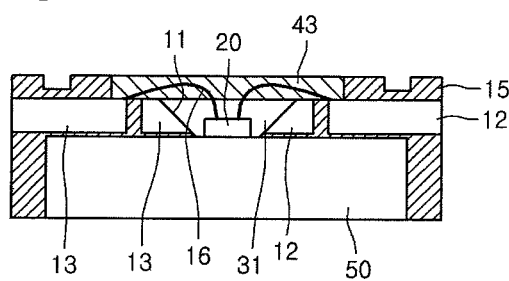

FIGS. 3 to 5 are views explaining a light emitting device package according to an embodiment 3.

The embodiment 3 is described with reference to FIGS. 3 to 5. Parts not explained can be the same as those of the previous embodiment.

Referring to FIG. 3, a light emitting device 20 is mounted in a light emitting device mounting portion 11 provided to a package body 15. The light emitting device 20 is electrically connected, through wires 16, to first and second lead frames 12 and 13 connected to the outside by passing through the package body 15.

A filling material 31 including phosphors are filled on the light emitting device 20. The filling material 31 formed by mixing phosphors with a synthetic resin such as a silicon gel and an epoxy resin fills the inside of the light emitting device mounting portion 11.

At this point, the phosphors can be phosphors that can emit various colors. That is, the phosphors can be materials emitting blue, green, yellow, and red light.

A molding portion 41 can be formed on the filling material 31 by coating silicon gel or an epoxy resin using various methods. That is, the molding portion 41 can be formed in a lens shape as illustrated in FIG. 3, or a plate-shaped molding portion 42 can be formed as illustrated in FIG. 4.

Meanwhile, referring to FIG. 5, the molding portion 43 can be formed lower than the case of FIG. 4 to lower the height of the whole package. At this point, the molding portion 43 having this low height can be obtained by forming low the height of the package body 15, and forming the molding portion 43 up to the height of the package body 15.

Embodiment 4

Figure 6:
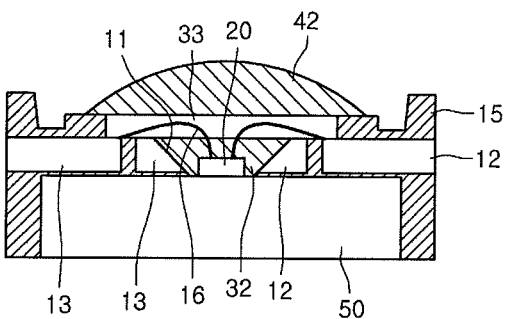
FIGS. 6 to 8 are views explaining a light emitting device package according to an embodiment 4.
Figure 7:
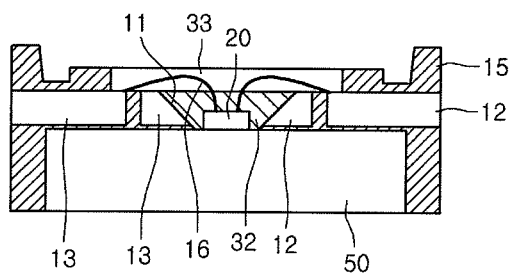
Figure 8:
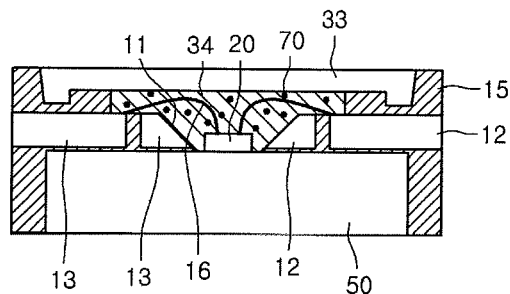

FIGS. 6 to 8 are views explaining a light emitting device package according to an embodiment 4. The embodiment 4 is described with reference to FIGS. 6 to 8. Parts not explained can be the same as those of the previous embodiment.

Referring to FIG. 6, a light emitting device 20 is mounted in a light emitting device mounting portion 11 provided to a package body 15. The light emitting device 20 is electrically connected, through wires 16, to first and second lead frames 12 and 13 connected to the outside by passing through the package body 15.

A filling material 32 formed of silicon gel or an epoxy resin is filled on the light emitting device mounting portion 11 on the light emitting device 20. The filling material 32 does not include phosphors.

Also, a phosphor layer 33 including phosphors can be formed on the filling material 32. The phosphor layer 33 can be formed by mixing the phosphors with a silicon gel or an epoxy resin.

That is, to prevent a phenomenon that emission from the phosphors is absorbed in the light emitting device 20 and so emission efficiency reduces, the filling material 32 formed of silicon gel or an epoxy resin is filled on the light emitting device 20, and the phosphor layer 33 formed by mixing the phosphors with silicon gel or the epoxy resin is coated thereon, so that a white light emitting device package of a high efficiency can be realized.

Also, since the phosphor layer 33 including the phosphors are spaced from the light emitting device 20 by the filling material 32, change in the characteristics of the phosphors by heat emitted from the light emitting device 20 can be prevented.

Also, since the phosphor layer 33 including the phosphors are spaced from the light emitting device 20 by the filling material 32, color uniformity can improve.

A lens shaped molding portion 42 can be formed on the phosphor layer 33 using a silicon gel or an epoxy resin as illustrated in FIG. 6. Also, the molding portion may not be formed on the phosphor layer 33 as illustrated in FIG. 7.

Meanwhile, referring to FIG. 8, in forming the filling material 34 on the light emitting device 20, a dispersing agent or a diffusing agent can be mixed in order to effectively disperse light emitted from the light emitting device 20, and increase the refractive index of the resin and thus improve light extraction of the light emitting device 20.

The dispersing agent or the diffusing agent 70 can be formed using at least one of $SiO_2$, $TiO_2$, and $ZrO_2$. The dispersing agent or the diffusing agent 70 can be included when the phosphor layer 33 or the molding portion 42 as well as the filling material is formed.

A phosphor layer 33 including phosphors can be formed on the filling material 34 to change the wavelength of light emitted from the light emitting device 20.

Embodiment 5

Figure 9:
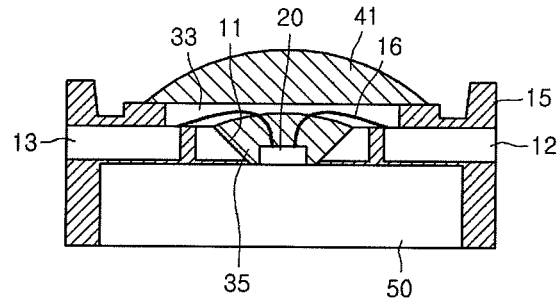
FIGS. 9 to 11 are views explaining a light emitting device package according to an embodiment 5.
Figure 10:
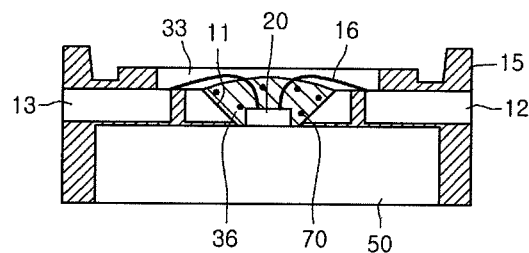
Figure 11:
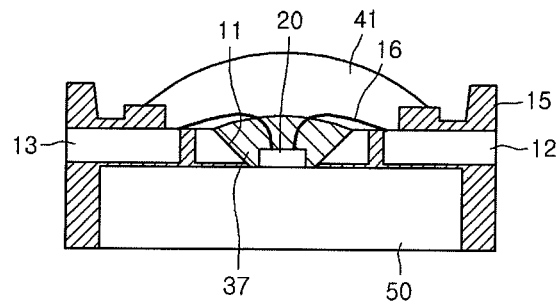

FIGS. 9 to 11 are views explaining a light emitting device package according to an embodiment 5.

Hereinafter, the embodiment 5 is described with reference to FIGS. 9 to 11. Parts not explained can be the same as those of the previous embodiment.

Referring to FIG. 9, a light emitting device 20 is mounted in a light emitting device mounting portion 11 provided to a package body 15. The light emitting device 20 is electrically connected, through wires 16, to first and second lead frames 12 and 13 connected to the outside by passing through the package body 15.

A dome-shaped filling material 35 formed of silicon gel or an epoxy resin is filled on the light emitting device mounting portion 11 on the light emitting device 20.

The dome-shaped filling material 35 is designed for improving light extraction efficiency. At this point, the dome-shape of a hemisphere can be more effective. Light passes vertically to a hemisphere surface regardless of the starting angle of the light.

Therefore, a high transmittance corresponding to an incident angle normal to the hemisphere surface can be obtained, and a total reflection angle does not exist anymore.

Referring to FIG. 9, the dome-shaped filling material 35 is formed on a silicon gel or an epoxy resin on the light emitting device mounting portion 11, and a phosphor layer 33 including phosphors is formed on the filling material 35 in order to improve the efficiency of the phosphor layer.

A lens-shaped molding portion 41 can be formed on the phosphor layer 33.

Meanwhile, referring to FIG. 10, a dome-shaped filling material 36 formed of a silicon gel or an epoxy resin mixed with a dispersing agent or a diffusing agent 70 having a high refractive index can be formed.

Also, referring to FIG. 11, a dome-shaped phosphor layer 37 can be formed on the light emitting device mounting portion 11 in which the light emitting device 20 is mounted. Since the refractive index of the phosphor layer 37 is greater than that of the silicon gel, the phosphor layer 37 can be more effective in improving light extraction efficiency. A lens-shaped molding portion 41 can be located on the dome-shaped phosphor layer 37.

Embodiment 6

Figure 12:
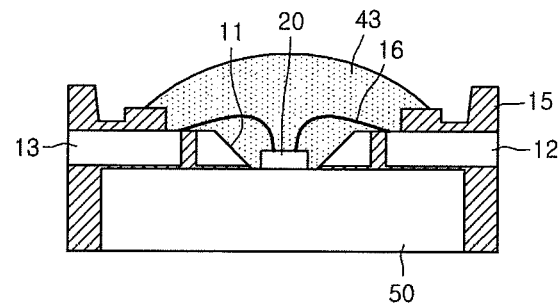
FIGS. 12 to 14 are views explaining a light emitting device package according to an embodiment 6.
Figure 13:
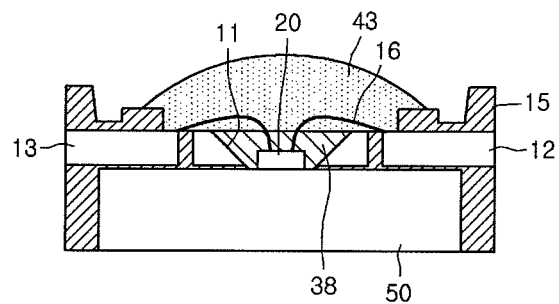
Figure 14:
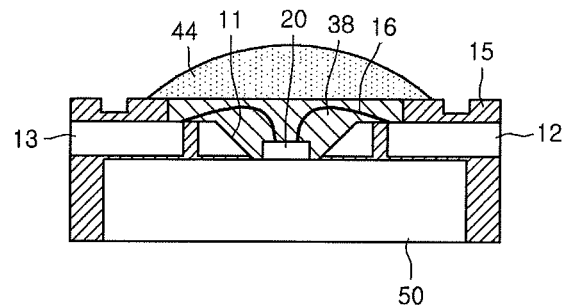

FIGS. 12 to 14 are views explaining a light emitting device package according to an embodiment 6.

Hereinafter, the embodiment 6 is described with reference to FIGS. 12 to 14. Parts not explained can be the same as those of the previous embodiment.

Referring to FIG. 12, a light emitting device 20 is mounted in a light emitting device mounting portion 11 provided to a package body 15. The light emitting device 20 is electrically connected, through wires 16, to first and second lead frames 12 and 13 connected to the outside by passing through the package body 15.

A dome-shaped molding portion 43 formed of silicon gel or an epoxy resin is filled on the light emitting device mounting portion 11 on the light emitting device 20. The molding portion 43 is mixed with phosphors. The molding portion 43 is molded in a dome-shape using a dispensing method to realize various colors and can serve as a lens.

FIG. 12 illustrates the entire upper space of the light emitting device mounting portion 11 is filled with the molding portion 43 such that a lens shape is formed.

Meanwhile, FIG. 13 illustrates an example in which the light emitting device mounting portion 11 in which the light emitting device 20 is mounted is filled with a filling material 38 formed of a material such as a silicon gel, and a molding portion 43 including phosphors is formed.

At this point, the molding portion 43 can include a dispersing agent or a diffusing agent.

FIG. 14 illustrates an example in which a filling material 38 is formed on the light emitting device mounting portion 11, and the filling material 38 is filled up to a portion higher than the package body 15, and a lens-shaped molding portion 44 including phosphors is formed on the filling material 38.

As described above, the molding portion 44 in the example illustrated in FIG. 14 can be manufactured in a lens shape.

As described above, in forming a filling material and a lens-shape when a light emitting device package is manufactured, a separately manufactured lens can be attached and the lens shape can be manufactured using a dispensing method while a silicon gel or an epoxy resin is coated, so that a structure that can increase light emission efficiency without an additional process.

Therefore, the light emitting device package according to the embodiment can be applied particularly to a decorative lighting requiring high power and high efficiency, a general light, an electric part for an automobile, and a backlight for an LCD.

The embodiments are provided to explain in detail the spirit of the present disclosure, and the present disclosure is not limited to the embodiments. It should be understood that numerous other modifications and embodiments can be devised by those skilled in the art that will fall within the spirit and scope of the principles of this disclosure.

INDUSTRIAL APPLICABILITY

The light emitting device package according to the embodiments can be used as a light source of various electronic apparatuses as well as a lighting apparatus.

The invention claimed is:

1. A semiconductor light emitting device package, comprising:
a package body having a cavity;
a first and second lead frames in the package body; and
a light emitting device disposed in the cavity of the package body and electrically connected with the first and second lead frames,
wherein the first lead frame includes a first hole formed therein and the second lead frame includes a second hole formed therein, and a first part of the package body is inserted into the first hole of the first frame and a second part of the package body is inserted into the second hole of the second lead frame, such that the first and second lead frames are fixed in a location by the package body,
wherein at least one of the first hole and the second hole surrounds a side surface of a respective one of the first part and the second part of the package body, and
wherein the first lead frame includes a metal layer and a reflective layer on the metal layer.

2. The semiconductor light emitting device package of claim 1, further comprising:
a filling material that includes phosphor.

3. The semiconductor light emitting device package of claim 1, wherein the package body includes a trench on an upper portion of the package body.

4. The semiconductor light emitting device package of claim 2, further comprising:
a lens on the filling material.

5. The semiconductor light emitting device package of claim 2, wherein the filling material includes a flat upper surface or a dome-shaped upper surface.

6. The semiconductor light emitting device package of claim 1, further comprising:
a phosphor layer on the light emitting device.

7. The semiconductor light emitting device package of claim 2, wherein the filling material includes a silicon or an epoxy.

8. The semiconductor light emitting device package of claim 1, further comprising:
a heatsink portion under the light emitting device, the heatsink portion being exposed from the package body on a bottom surface of the package body.

9. The semiconductor light emitting device package of claim 8, wherein the first and second lead frames and the heatsink portion include the same metal material.

10. The semiconductor light emitting device package of claim 2, wherein the filling material includes a dispersing agent or a diffusing agent.

11. The semiconductor light emitting device package of claim 10, wherein the dispersing agent or the diffusing agent comprises at least one selected from the group consisting of $SiO_2$, $TiO_2$, and $ZrO_2$.

12. The light emitting device package according to claim 1, wherein the first and second lead frames each include an inclined side surface.

13. The light emitting device package according to claim 12, wherein another cavity is formed to create a space between the inclined side surface of the first lead frame and the inclined side surface of the second lead frame.

14. The light emitting device package according to claim 1, wherein the first lead frame is disposed along an outer side surface of the first part of the package body.

15. The light emitting device package according to claim 1, wherein the first lead frame contacts an entire side surface of the first part of the package body.

16. The light emitting device package according to claim 1, wherein the reflective layer includes Ag and the metal layer includes Cu.

17. A semiconductor light emitting device package, comprising:
a package body having a cavity;
first and second lead frames in the package body; and
a light emitting device disposed in the cavity of the package body and electrically connected with the first and second lead frames,
wherein the first lead frame includes a first recess formed therein, the second lead frame includes a second recess formed therein, and a portion of the package body is coupled to the first recess of the first lead frame such that the first lead frame is fixed in a location by the package body,
wherein the first recess has a continuous side surface,
wherein the first lead frame includes a reflective layer,
wherein the first lead frame is spaced apart from the second lead frame,
wherein the package body includes a trench on an upper portion of the package body, and
wherein the cavity is filled with a filling material including phosphor.

18. The light emitting device package according to claim 17, wherein the trench is formed at position lower than a top surface of the package body.

19. A semiconductor light emitting device package, comprising:
- a package body having a cavity;
- first and second lead frames in the package body;
- a light emitting device disposed in the cavity of the package body and electrically connected with the first and second lead frames; and
- a filling material covering the light emitting device,
- wherein the first lead frame includes a first recess formed therein and the second lead frame includes a second recess formed therein,
- wherein a first portion of the package body is coupled to the first recess of the first lead frame, and a second portion of the package body is coupled to the second recess of the second lead frame,
- wherein the first recess surrounds a side surface of the first portion of the package body, and the second recess surrounds a side surface of the second portion of the package body,
- wherein the first lead frame includes a metal layer and a reflective layer on the metal layer, and
- wherein the first lead frame is electrically separated from the second lead frame.

20. The light emitting device package according to claim 19, wherein the package body includes a trench on an upper portion of the package body, and the filling material includes silicon and luminescent material.

* * * * *